(12) United States Patent
Chen et al.

(10) Patent No.: US 12,273,096 B2
(45) Date of Patent: Apr. 8, 2025

(54) DRIVER CIRCUIT FOR A GaN SWITCH MODE POWER CONVERTER

(71) Applicant: SIGNIFY HOLDING B.V., Eindhoven (NL)

(72) Inventors: Zhiquan Chen, Shanghai (CN); Jie Fu, Shanghai (CN); Yu Wang, Shanghai (CN); Shan Wang, Shanghai (CN); Gang Wang, Shanghai (CN); Feng Ju, Shanghai (CN)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 18/032,420

(22) PCT Filed: Oct. 22, 2021

(86) PCT No.: PCT/EP2021/079366
§ 371 (c)(1),
(2) Date: Apr. 18, 2023

(87) PCT Pub. No.: WO2022/090984
PCT Pub. Date: May 5, 2022

(65) Prior Publication Data
US 2023/0387902 A1    Nov. 30, 2023

(30) Foreign Application Priority Data

Oct. 26, 2020  (WO) ................ PCT/CN2020/123770
Dec. 22, 2020  (EP) ..................................... 20216346

(51) Int. Cl.
H03K 17/06    (2006.01)
H02M 1/08    (2006.01)
H02M 3/158    (2006.01)

(52) U.S. Cl.
CPC ............ H03K 17/063 (2013.01); H02M 1/08 (2013.01); H02M 3/158 (2013.01)

(58) Field of Classification Search
CPC ..................................................... H03K 17/063
(Continued)

(56) References Cited

U.S. PATENT DOCUMENTS

| 2008/0037807 | A1 | 2/2008 | Honda |
| 2016/0181929 | A1* | 6/2016 | Chen ........................ H02M 1/08 363/21.18 |
| 2019/0103804 | A1 | 4/2019 | Knoedgen et al. |

FOREIGN PATENT DOCUMENTS

| DE | 19730220 A1 | 1/1999 |
| EP | 0514064 A2 | 11/1992 |
| EP | 0514064 A3 | 8/1993 |

OTHER PUBLICATIONS

Linear Technology, "Boost Controller with Power Factor Correction", LT8312.

* cited by examiner

*Primary Examiner* — Tomi Skibinski

(57) ABSTRACT

A driver circuit is for driving a GaN power commutation switch of a switch mode power converter. A sensing component is connected to the GaN switch for sensing a parameter such as a peak current of the power commutation. An energy storage component provides a certain turn on voltage between the gate and source of the GaN switch. The charging and discharging of the energy storage component is regulated, and the sensing is disabled with timing which is synchronized with the charging and discharging function of the energy storage component. It is prevented that a voltage across the sensing component reduces the generated gate-source drive voltage of the GaN switch.

15 Claims, 7 Drawing Sheets

(58) Field of Classification Search
USPC .......................................................... 327/109
See application file for complete search history.

DRIVER CIRCUIT FOR A GaN SWITCH MODE POWER CONVERTER

CROSS-REFERENCE TO PRIOR APPLICATIONS

This application is the U.S. National Phase application under 35 U.S.C. § 371 of International Application No. PCT/EP2021/079366, filed on Oct. 22, 2021, which claims the benefit of European Patent Application No. 20216346.5, filed on Dec. 22, 2020 and Chinese Application No. PCT/CN2020/123770 filed on Oct. 26, 2020. These applications are hereby incorporated by reference herein.

FIELD OF THE INVENTION

This invention relates to switch mode power converters, in particular having a GaN power commutation switch.

BACKGROUND OF THE INVENTION

Switch mode power converters have widespread use.

Traditional switch mode power converters make use of a MOSFET power commutation switch which controls commutation between an energy storage mode of an energy storage component (typically an inductor) and a flyback/freewheeling mode during which energy is released from the energy storage component to the output load. The switching, such as the duty cycle of the energy storage mode and the flyback mode, of the power commutation switch controls an energy transfer ratio between the input and output, and the circuit may for example be a boost converter, a buck converter, a buck-boost converter or a flyback converter. More sophisticated circuit may for example be a LLC, LCC, Cuk, SEPIC, or BiFRED converter. The general principle is similar: energy storage and freewheeling.

A sensing resistor is typically connected in series with the MOSFET power commutation switch, to provide a current sensing feedback signal. A gate driver of for the MOSFET power commutation switch has a high voltage, for example 12V or 15V, compared to the threshold voltage Vth of the MOSFET power commutation switch (such as around 3.5V) such that a voltage drop across the sensing resistor does not impact on the circuit operation.

The gate driver can be connected directly to ground while not taking into consideration the influence of voltage on sensing resistor.

There is a desire to adopt GaN transistors as the power commutation switch for switch mode power supplies for high power applications, for example GaN HEMTs. These transistors have high breakdown voltages, low parasitic capacitances and low turn on resistances (hence efficient operation). The advantage of the GaN transistor also includes the capability of higher frequency switching, reducing the size of the energy storage component, thus minimizing the size of the overall switch mode power converter.

However, the turn on threshold voltage for these transistors is much closer to zero, such as around 1.5V, and is also close to the typical gate drive voltage of around 6V. The influence of the voltage on a current sensing resistor to the gate drive signal of a GaN transistor can not be ignored, otherwise it could lead to oscillation or linear operation or high drain-source on-resistance, which will harm the power commutation switch. In short, the gate-source driving voltage for a GaN switch has to be accurate and stable, unlike that for a MOSFET which has greater tolerance.

FIG. 1 shows an example of a known circuit to drive a GaN power commutation switch of a switch mode power converter for addressing these issues.

The example shows a boost converter with an energy storage inductor L1, a power commutation GaN switch M1 and a current sense resistor RCS in series between a drain of the GaN switch and ground. An input capacitor C2 is between the positive input and ground. The node between the inductor L1 and the power commutation switch M1 connects to the load LED through the freewheeling diode D1, and an output capacitor C1 is in parallel with the load.

A supply voltage VCC is derived from the high voltage side of the power commutation switch M1 and stored on a capacitor C3. Thus is used to supply a first Low Dropout regulator LDO1 which provides the power supply for a control unit MCU. This power supply is stored across a capacitor C5. The control unit MCU receives the voltage across the sense resistor RCS as a current sense feedback signal CS, and this is used by the controller to time the switching of the power commutation switch M1.

The supply voltage VCC is also used to supply a second, 6V, Low Dropout regulator LDO2 which provides the gate drive signal for the power commutation switch, stored across a capacitor C4. The gate drive signal is s optionally provided via a gate driver circuit GDr, such as a push-pull transistor bridge, etc.

The capacitor C4 stores a gate-source drive voltage for the power commutation switch M1 (rather than a gate to ground voltage).

A problem with this circuit is that supply voltage VCC is referenced to the ground but the 6V regulator LDO2 is to supply the GaN driver circuit GDr whose ground is connected to the source of GaN power commutation switch. These two supplies use different grounds.

The circuit of FIG. 1 is still influenced by the current sensing resistor on the gate-source voltage of the power commutation switch M1, since the regulator LDO2 is connected to the ground via the current sensing resistor RCS. Voltage spikes on the current sense resistor RCS, in the case that the power commutation switch M1 is on and the current sense resistor RCS is sensing the power current, could lead to a drop of the voltage across the capacitor C4 and hence the gate-source voltage of the GaN switch M1 when it turns on, which may hamper the turning on of the GaN switch M1 or introduce oscillation. In particular, the regulator LDO1 is influenced by the voltage across RCS because of the relatively low speed of response of the regulator LDO1, and because a small voltage drop across the regulator LDO1 is preferred (for better efficiency). Thus, the voltage across the capacitor C4 may not be very stable. The current flowing through C4 when it is charged or discharged will also flow through the sense resistor RCS and influence the sensing voltage on RCS, and can thereby influence the feedback control loop.

There is therefore a need for an improved driver circuit for driving a GaN power transistor of a switch mode power converter.

US20160181929A1 and Linear Technology "LT8312 Boost Controller with Power Factor Correction" disclose blanking the signal on a sensing resistor for a while after the switch is turned on. EP0514064A2 discloses a circuit to control timing of a switch, wherein the turning on of the switch triggers a capacitor in a RC timing circuit to discharge and turn off the switch if the capacitor is discharged below a certain threshold value.

SUMMARY OF THE INVENTION

The invention is defined by the claims.

Though a sensing component of a switch mode power supply is essential for the control loop such as current control loop, it is a concept of the invention to store the energy required for switching on the power commutation switch of a switch mode power converter in an energy storage element, and to control the charging and/or discharging of that energy storage element without influence of the sensing component so that the power commutation switch can be turned on stably. In addition, the feedback sensing function is not affected. The charging and discharging of the energy storage component is regulated with timing that is synchronized with a decoupling of a sensing path. This decoupling may be an electrical decoupling or a logical decoupling (i.e. implemented based on the feedback control timing). In short, the examples of the invention selectively leave out the function of the sensing component, at the moment when regulating the energy required for switching on the power commutation switch. This selection is an unobvious choice from prior art in which the sensing component is always sensing the power current and influencing the regulation of the energy for switching on the power commutation switch in the switch mode power supply.

According to examples in accordance with an aspect of the invention, there is provided a driver circuit for driving a power commutation GaN switch of a switch mode power converter, the power converter having in a power commutation an energy storage phase when the GaN switch is closed and a freewheeling phase when the GaN switch is open, the driver circuit comprising:
- a sensing component connectable to the GaN switch and adapted to sense a parameter of the power commutation, the sensing component being in a sensing path;
- an energy storage component to provide a certain turn on voltage between the gate and source of the GaN switch;
- a controlling circuit connected to the GaN switch to control its switching and to regulate the charging and discharging of the energy storage component according to the sensed parameter of the power commutation for feedback control purpose,
- wherein the controlling circuit is adapted to regulate the charging of energy storage component via the sensing component to derive the certain turn on voltage between the gate and source of the GaN switch when the control unit does not use the signal (CS) on the sensing component for feedback control purpose at this time; and/or the discharging of the energy stored in the energy storage component to provide the certain turn on voltage to the GaN switch to turn the GaN switch on without via the sensing component by decoupling the sensing component from sensing the parameter of the power commutation.

This driver circuit prevents the voltage drop across a sensing component from having an effect on the energy storage component for switching on of the GaN switch, so that a desired turn-on voltage (e.g. 6V) is provided.

Decoupling the sensing path from sensing the parameter of the power commutation means that, at that time of regulating the charging/discharging of the energy stored in the energy storage component, the sensing component is not carrying out its function of sensing a parameter of the power commutation.

In an example to be described in more detail below, a charging current of the energy storage component may still flow though the sensing component but at that time the sensing component is not sensing the parameter of the power commutation. Thus, the term "decouple" may not only be a physical or electrical decoupling, but it may also be a logical decoupling in that the sensing component is still present but does not sense the parameter. For example, a charging or discharging current may flow through the sensing component even when the sensing path is decoupled, but the sensed signal (e.g. voltage) is not interpreted as a feedback parameter, and the voltage drop on the sensing component eventually does not influence the voltage of the energy storage component.

Embodiments of the invention prevent a voltage across the sensing component reducing the generated gate-source drive voltage of the GaN switch. The energy storage component, such as a capacitor, may for example store the desired gate-source drive voltage in such a way that it can be applied between the gate and source. On the other hand, this example of the invention also prevents the charging/discharging of the energy storage component from influencing the sensing path.

Instead of a passive energy storage component which stores a gate-source voltage (as in the prior art), charging and discharging of the energy storage component is regulated by the controlling circuit. This for example enables control of the timing of the charging and discharging current so that voltage spikes do not arise on the sensing component when sensing is taking place.

The sensed parameter is for example a current flowing, for example a peak current in the energy storage phase.

The sensing component is for example a sensing resistor connected between the source of the GaN switch and the ground.

In one example, the driver circuit further comprises a control loop, preferably a feedback control loop that is adapted to use the parameter sensed by the sensing component. This embodiment manifests that the sensing path that is usually essential and indispensable, in the view point of those skilled in the art, for the control loop. Therefore, it is unobvious for those skilled in the art to decouple it for handling the energy storage component.

In one example of the invention, the controlling circuit may be adapted to regulate the discharging of the energy stored in the energy storage component to turn on the GaN switch while decoupling the sensing path involving the sensing component during turn on of the GaN switch.

In other words, the regulating of the energy storage component to turn on the GaN switch is at a different time to the sensing function of the sensing path involving the sensing component. Thus, the sensing path can be disabled when the sensing function is not needed. Therefore, the energy storage component can provide its voltage fully to the GaN switch to turn on it stably and also does not influence the sensing function of the sensing component.

The sensing path may be disabled by providing that the sensing component is shorted, or the sensing path may be disabled because the sensing function is not carried out during turn on of the GaN switch, even though the sensing component will be still functional later after the GaN switch has been stably turned on.

The controlling circuit may be adapted to (re-) couple the sensing path such that the sensing component is adapted to sense an amount related to charged energy in the energy storing phase of the power commutation, after the GaN switch has been turned on. At that moment, the requirement on the voltage across the gate and source of the GaN switch to keep the GaN switch is relaxed and the voltage variation due to any voltage spike on the sensing component will not hamper the turn on of the GaN switch any more.

Thus, the sensing component can be disabled until the energy storage phase commences.

The driver circuit may comprise a voltage regulator for supplying the controlling circuit from the energy storage component, and said voltage regulator is adapted to output the certain turn on voltage and is coupled to a gate drive terminal and ground. Thus, since the LDO regulator and the GaN switch is co-grounded (since the sensing path is decoupled), a single LDO regulator is needed in the circuit to provide the stable turn on voltage.

The gate drive terminal may connect to the gate of the GaN switch or it may connect to a gate driver which then applies a drive voltage to the gate. A gate driver such as a push-pull transistor bridge/half bridge may be additionally provided to turn on the GaN switch, but it is only optional.

In a first set of examples, a shorting switch is provided for shorting the sensing component, wherein the energy storage component is supplied by a supply voltage and connected to ground, and the controlling circuit is adapted to:

discharge the energy storage component via the voltage regulator to provide the turn-on voltage across the gate and source of the GaN switch to turn on the GaN switch meanwhile temporally shorting the sensing component using the shorting switch; and end shorting of the sensing component after the GaN switch has been completely turned on, use the voltage on the energy storage component via the voltage regulator to keep the GaN switch on and allow the sensing component to sense the parameter of the energy storing phase.

In this first set of examples, the voltage provided by the energy storage component is routed (discharged) to the gate (and hence to the gate-source junction) of the GaN switch without flowing into the sensing component. The current through the GaN switch thus does not flow through the sensing component and does not change the voltage potential of the source of the GaN switch, so that switching can be reliably performed with the low voltage on the energy storage component. The discharging current of the energy storage component neither flows through the sensing component thus does not influence the current sensing.

The discharge of the energy storage component may then be at the beginning of the energy storage phase and the sensing component is short circuited at this time. The shorting of the sensing component avoids the influence of a voltage spike caused by the power current through the GaN switch on the sensing component.

The energy storage component may be coupled to the gate of the GaN switch via a Low Dropout regulator as the voltage regulator. The driver circuit may then further comprise a gate driver circuit at the output of the Low Dropout regulator, and the Low Dropout regulator and the gate driver circuit are connected to ground.

Thus, the gate driver circuit can be referenced to ground despite the sensing component being in the path to ground, because the sensing component is shorted during turn on of the GaN switch.

Since the time to turn on the GaN switch is quite short compared with the whole energy storage phase, the sensing component is switched back to fulfill the sensing function, meanwhile the energy storage component's voltage is sufficient to keep the GaN switch on since the requirement on a voltage for keeping the GaN switched on is much looser (not required to be so accurate and stable) than that for turning the GaN switch on.

In a second set of examples, the control unit is adapted to:
use the signal on the sensing component for feedback control purpose in the charging phase, and
not use the signal on the sensing component for feedback control purpose in the freewheeling phase, and the energy storage component is coupled to the gate and source of the GaN switch, and the controlling circuit is adapted to charge the energy storage component via the sensing component in the freewheeling phase during which the control unit does not use the signal (CS) on the sensing component for feedback control purposes at this time.

In this second set of examples, the energy storage component is not referenced to ground in this case. Instead, it is charged to a sufficient level in the freewheeling phase and applies a sufficient voltage directly between the gate and source so that a voltage drop across the sensing component does not influence the turn on of the GaN switch. However, separate power supplies are not needed, despite the different ground references in different parts of the circuit. In the freewheeling phase, the sensing component is not operated to sense the commutation parameter, since this is a different time to a sensing time.

With a dedicated capacitor for the gate-source voltage, the charging may be at any moment in the freewheeling phase since at this time there is no power commutation to be sensed by the sensing component, and the power commutation does not influence the charging of this capacitor.

The controlling circuit is for example adapted to charge the energy storage component from a supply voltage (VCC) via the sensing component, in the freewheeling phase in which the control unit does not use the signal (CS) on the sensing component for feedback control purposes at this time. Decoupling the sensing path means that the sensing path is logically open since the power switch is open in the freewheeling phase.

The charging takes place through the sensing component. However, the sensing path is decoupled during this time. Since the sensing component is usually a low impedance component, the energy storage component can be charged to the sufficient and accurate voltage in time in the freewheeling phase.

The supply voltage may be coupled to the energy storage component via a voltage regulator, the voltage regulator is adapted to output the certain turn on voltage, and the controlling circuit is adapted to charge the voltage of the energy storage component to the output voltage of the voltage regulator.

The voltage regulator may be connected to ground, the negative terminal (cathode) of the energy storage component may be coupled to the ground via the sensing component, and the positive terminal (anode) of the energy storage component may be coupled to the gate of the GaN switch. In this example, the voltage regulator would charge the energy storage component to the turn on voltage eventually in the freewheeling phase.

The coupling to the gate may be via a gate driver circuit. A ground terminal of the gate driver circuit may then be connected to the source of the GaN switch.

The invention also provides a power converter comprising:
a power communication component;
a GaN switch;
a freewheeling diode; and
the driver circuit defined above for driving the GaN switch.

The power communication component, the GaN switch and the sensing component are in series between a power input and ground, and are adapted to define the sensing path.

Any topology of converter may be used as long as it includes a series connection of power commutation switch and sensing component (with or without the load in series), and examples of the invention can overcome the interference between the sensing component and the energy storage component for turning on the GaN switch in those topologies. The power converter may for example comprise a boost converter, a buck converter, a buck-boost converter or a flyback converter.

These and other aspects of the invention will be apparent from and elucidated with reference to the example(s) described hereinafter.

BRIEF DESCRIPTION OF THE DRAWINGS

For a better understanding of the invention, and to show more clearly how it may be carried into effect, reference will now be made, by way of example only, to the accompanying drawings, in which.

DETAILED DESCRIPTION OF THE EMBODIMENTS

Figure 1:
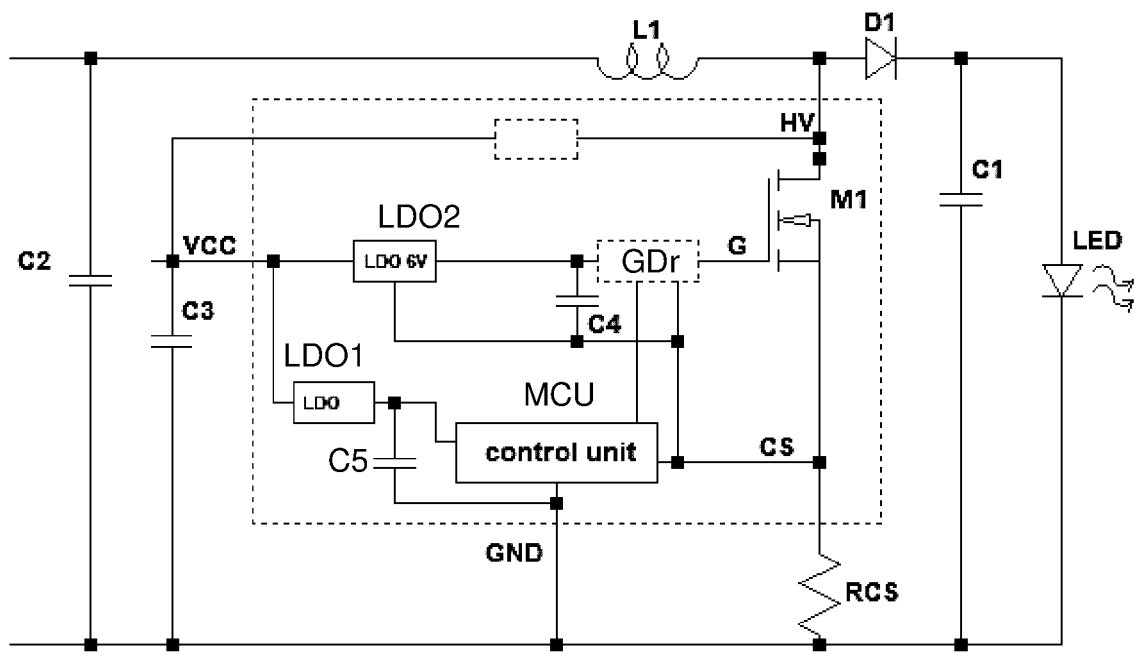
FIG. 1 shows an example of a known circuit to drive a GaN power commutation switch of a switch mode power converter.

The invention will be described with reference to the Figures.

It should be understood that the detailed description and specific examples, while indicating exemplary examples of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts.

The invention provides a driver circuit for driving a GaN power commutation switch of a switch mode power converter. A sensing component is connected to the GaN switch for sensing a parameter such as a peak current of the power commutation. An energy storage component provides a certain turn on voltage between the gate and source of the GaN switch. The charging and/or discharging of the energy storage component is regulated at specific times, and the sensing is disabled with timing which is synchronized with the specific times of charging and/or discharging of the energy storage component. It is prevented that a voltage across the sensing component reduces a voltage on the energy storage component and thereby the generated gate source driver voltage of the GaN switch. It is also prevented that the charging and discharging of the energy storage component influences the sensing of the sensing component.

Figure 2:
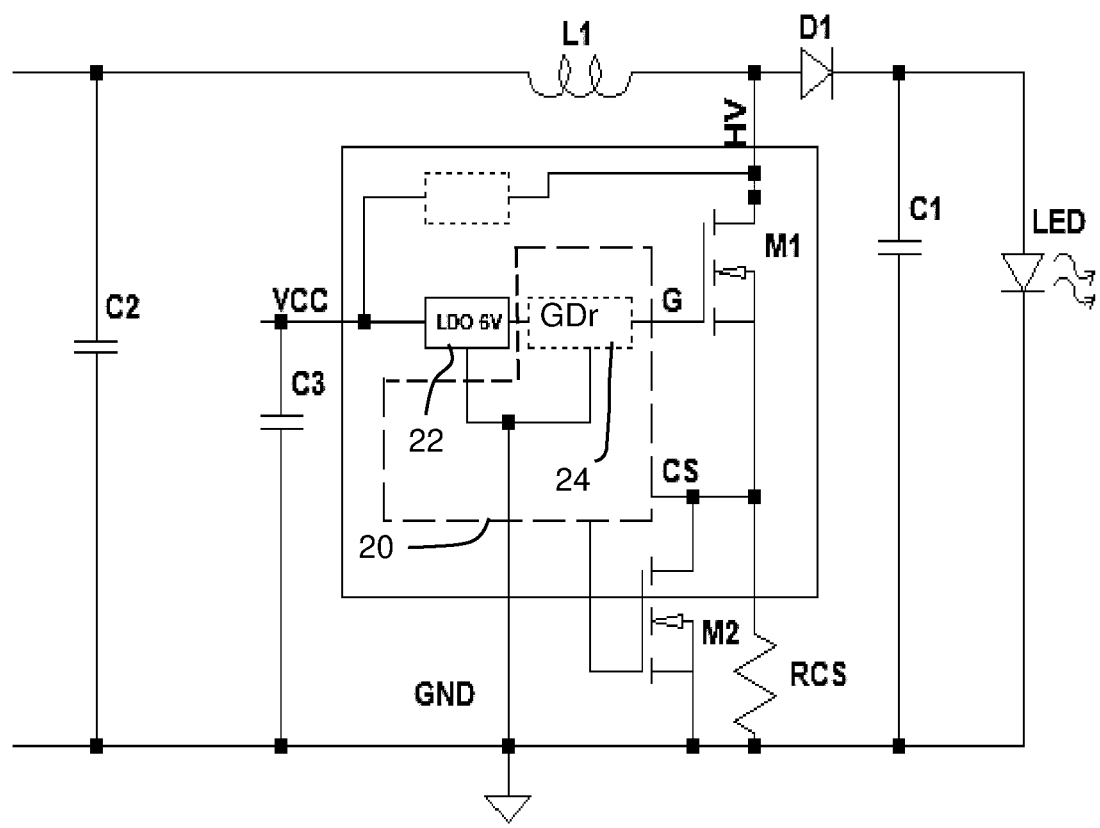
FIG. 2 shows a first example of a boost converter architecture.

FIG. 2 shows a boost converter architecture which employs the driver circuit of a first example of the invention.

FIG. 2 shows the same inductor L1, freewheeling diode D1, output storage capacitor C1, power commutation GaN switch M1, sensing component RCS, input capacitor C2 and load LED as in the circuit of FIG. 1. As in the example of FIG. 1, the sensing component is a sensing resistor RCS connected between the source of the GaN switch and the ground GND.

The power converter has an energy storage phase when the GaN switch M1 is closed. Current then flows from the input through the inductor L1 and GaN switch M1 to ground. Energy is stored in the inductor, and the load LED is supplied by the output capacitor C1. A freewheeling phase takes place when the GaN switch M1 is open. The energy stored in the inductor L1 as well as the input is delivered to the load (and the output capacitor C1).

A controlling circuit 20 is connected to the gate G of the GaN switch M1 to control its switching but also to regulate the charging and discharging of the energy storage component, namely capacitor C3. The capacitor C3 stores the supply voltage VCC and it functions as an energy storage component to discharge to provide a certain turn on voltage between the gate and source of the GaN switch.

This circuit has a single regulator 22 for supplying the controlling circuit 20 from the energy storage component C3. The voltage regulator 22 is adapted to output the certain turn on voltage and is coupled to a gate drive terminal and ground GND. In this example, the gate drive terminal is the input to a gate driver circuit 24 (GDr) which then connects to the gate G. The gate driver circuit 24 is a well known circuit such as a half-bridge circuit to facilitate the control on gate G. To be noted is that the gate driver circuit 24 is optional, and the most important thing is that an accurate and stable turn-on voltage, such as 6V in one example (depending on the particular GaN switch design), should be provided to gate-source of the GaN switch.

The regulator 22 may for example be a Low Dropout regulator 22 and the gate driver circuit 24 are connected to ground GND. Thus, there is only one ground reference in this circuit.

In this example, the decoupling of the sensing path involves use of a shorting switch M2 in parallel with the sensing component RCS for shorting the sensing component. The shorting switch can be a low voltage MOSFET.

The controller 20 discharges the energy storage component C3 via the voltage regulator 22 to provide the turn-on voltage across the gate and source of the GaN switch to turn on the GaN switch M1. At this time, the sensing component RCS is temporarily shorted using the shorting switch M2. Since the energy storage component C3, the LDO 22 and the source of the GaN switch M1 are co-grounded at this moment (RCS is short circuited), the LDO 22 can accurately and stably provide the 6V voltage to the gate-source of the GaN switch M1, thus turns on it without interference.

The shorting function is ended after the GaN switch M1 has been completely turned on. The sensing path is then (re-) coupled. The voltage on the energy storage component C3 continues to keep the GaN switch M1 on via the voltage regulator 22 (a GaN switch is voltage-driven, unlike a BJT transistor that is current-driven), and allow the sensing component RCS to sense the parameter of the energy storing phase. The sensed parameter can thus be used as a feedback sensing signal.

Thus, in this example, the discharging of the energy stored in the energy storage component C3 to turn on the GaN switch takes place during turn on of the GaN switch. During this time the sensing path involving the sensing component is decoupled.

This circuit has a stable voltage reference VCC stored on the capacitor C3 which is connected to the common ground. It is used to generate an accurate GaN driving voltage such as 6V. The charging of C3 does not need to be timed with the charging or freewheeling phase of the converter.

The sensing resistor RCS is bypassed (shorted) around the turn on time of the GaN switch, during which time the source of the GaN switch M1 is coupled to the common ground. Thus, the source of the GaN switch M1 and the capacitor C3 is co-grounded. The voltage on C3 is able to turn on the GaN switch M1 via the LDO 22 accurately without any damage from an overvoltage driving condition and without driving with an under voltage insufficient to turn it on fully.

The shorting function also avoids the influence of voltage spikes caused by the power current through the GaN switch M1 on the sensing resistor to the 6V voltage across the gate and the ground (and hence the source) when the GaN switch is turned on.

The sensing path can be re-coupled after the turn on transient period has completely passed. The sensing resistor can then be used to detect the peak current signal for the control of the converter circuit in conventional manner. There is still sufficient time for the input current to reach the peak current detected by the sensing resistor, thus the current control of the switch mode power supply is not influenced.

When the resistor RCS is re-coupled into the circuit, the gate-source voltage Vgs will change a small amount, more specifically decreased by the voltage on RCS. However, since the GaN switch M1 is already fully turned on, this changed voltage Vgs will not significantly influence the state of the GaN switch M1, or turn it off, or make it oscillate.

Figure 3:
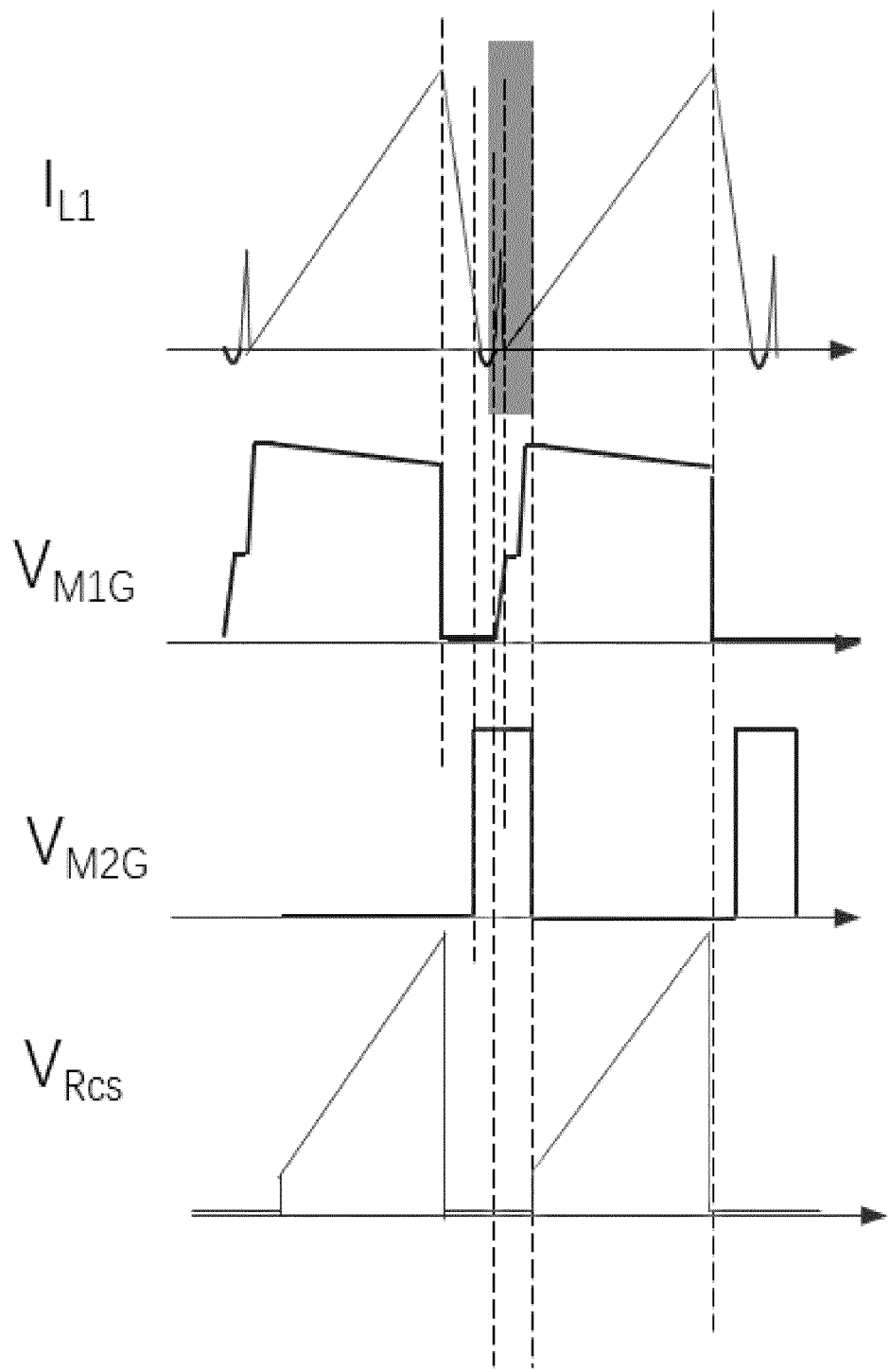
FIG. 3 shows operating waveforms for the circuit of FIG. 2.

FIG. 3 shows operating waveforms for the circuit.

The top plot shows the inductor current IL1 The second plot shows the gate voltage $V_{M1G}$ of the power commutation GaN switch M1. The third plot shows the gate voltage $V_{M2G}$ of the shorting switch M2. The bottom plot shows the voltage $V_{RCS}$ across the current sense resistor. The turn on process of the GaN switch M1 is not influenced by a voltage spike at the source since M2 is turned on so the source is connected to ground. The peak current sensing is also not influenced for circuit loop control, since the valid signal reflecting the peak current is still present. The driver circuit can thus guarantee the operation of the power commutation switch with a single power supply while not influencing the current sensing function used by the feedback control loop.

Figure 4:
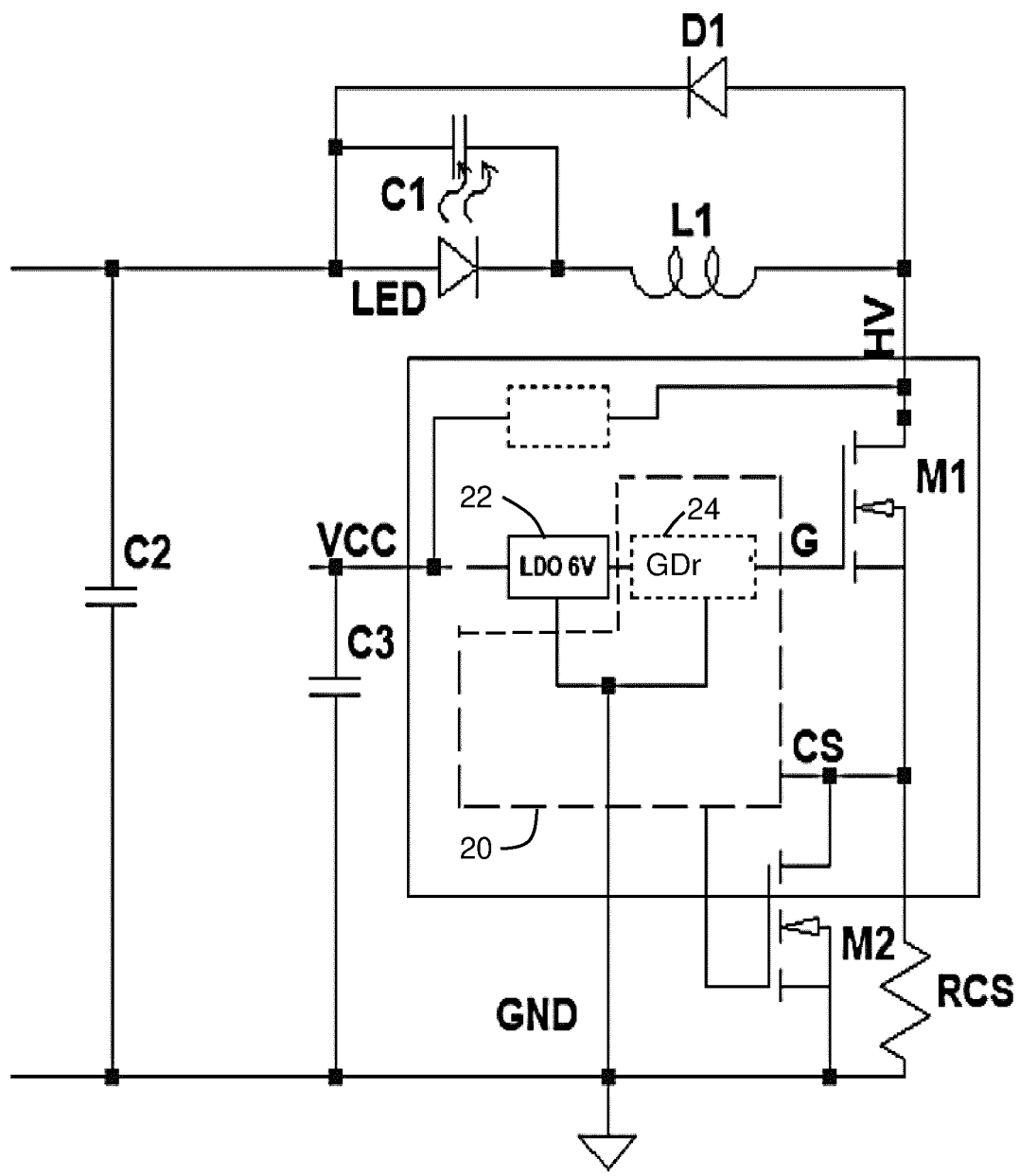
FIG. 4 shows the same circuit approach of FIG. 2 applied to a buck converter architecture.

FIG. 2 shows a boost converter architecture. FIG. 4 shows the same circuit approach applied to a buck converter architecture.

The same components are given the same names. The shorting switch M2 is again a low voltage MOSFET which is turned on before the power commutation switch M1 is turned on, and is turned off after the end of the transient turn on time of the GaN switch M1.

In the buck converter topology, when the power commutation GaN switch M1 is turned on, the input delivers current to the load LED and output capacitor C1 and the inductor L1 in series. When the GaN switch is turned off, the inductor L1 delivers current through the freewheeling diode D2, to the load LED and output capacitor and the inductor L1 in series.

Figure 5:
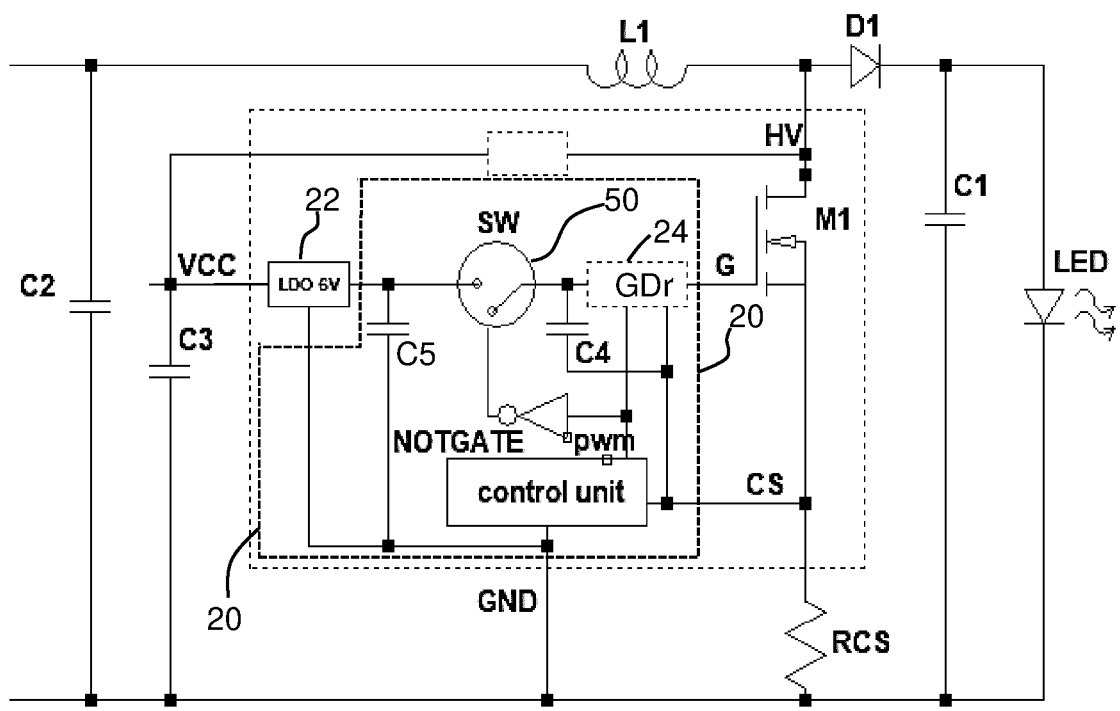
FIG. 5 shows a second example of a boost converter architecture.

FIG. 5 shows a second circuit approach, applied to a boost converter architecture.

FIG. 5 shows the same inductor L1, freewheeling diode D1, output storage capacitor C1, power commutation GaN switch M1, sensing component RCS, input capacitor C2 and load LED as in the circuit of FIG. 1. As in the example of FIG. 1, the sensing component is a sensing resistor RCS connected between the source of the GaN switch and the ground GND.

The power converter has an energy storage phase when the GaN switch M1 is closed. Current then flows from the input through the inductor L1 and GaN switch M1 to ground. Energy is stored in the inductor, and the load LED is supplied by the output capacitor C1. A freewheeling phase takes place when the GaN switch M1 is open. The energy stored in the inductor L1 is delivered to the load (and the output capacitor C1).

This circuit has a separate energy storage component C4 for storing the gate-source voltage of the power commutation switch M1. It is connected between the gate and source of the GaN switch M1.

The controlling circuit 20 is connected to the gate G of the GaN switch M1 to control its switching but again also to regulate the charging and discharging of the energy storage component, namely capacitor C4. The charging of the energy storage component C4 takes place in the freewheeling phase, and this is when the sensing path is decoupled.

The circuit again has a single regulator 22 which has the voltage supply VCC as input. The voltage regulator 22 is connected to ground, and the negative terminal of the energy storage component C4 is coupled to the same ground via the sensing component. The output of the regulator 22 is stored on capacitor C5 which connects to ground. The anode of the energy storage component C4 is coupled to the gate of the GaN switch.

A switch SW is in series between the output of the regulator 22 and the anode (positive terminal) of the capacitor C4. The capacitor C4 is charged through this switch SW and through the sensing component RCS. During this time, which is during the freewheeling phase, the sensing path is decoupled.

In this case, the decoupling is a logical function. There is still a voltage across the sensing component RCS while a charging current is flowing but the control unit does not use the signal CS for feedback control purposes at this time. In a RC circuit charged by a DC voltage, the capacitor C4 will eventually charge to the DC voltage if there is sufficient time. Since the sensing component is quite small, the time to charge the capacitor C4 to the 6V level is quite short, in normal operation (wherein the capacitor C4 still has residual voltage after the last turn on operation).

The gate driver 24 controls the operation of the switch SW. In particular, an inversion of the gate drive signal may be used to control the switch SW. In this way, the energy storage component C4 is charged when the main switch has been turned off in the freewheeling phase. Thus, the charging of the energy storage component C4 does not influence the sensing function of RCS which takes place only in the charging phase of the boost converter. The energy storage component C4 is fully charged to 6V in the stable state. There is then no charging current and hence no voltage drop across RCS.

The energy storage component C4 is discharged to turn on the main switch stably since it already couples between the gate and source. The switch SW is off when the GaN switch is on, so that during this time, the energy storage component C4 provides the energy to drive the power commutation switch during this time period, directly referred to the source of the switch M1 rather than a common ground. The power current from the input and through the sensing resistor, in turn the voltage spike on the sensing resistor, does not influence the voltage across the gate and source of the GaN switch, which voltage is provided by the capacitor C4 independently.

Figure 6:
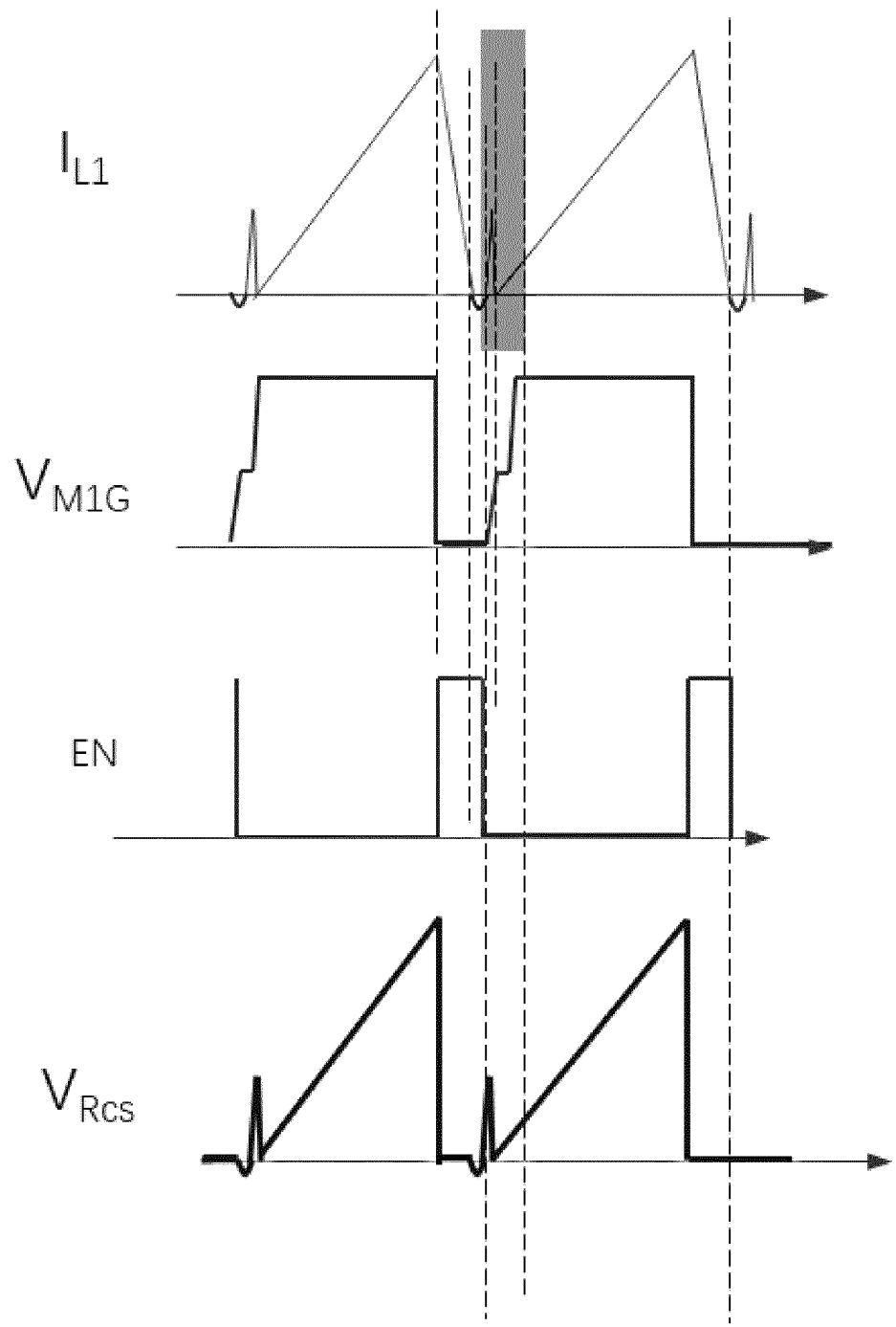
FIG. 6 shows operating waveforms for the circuit of FIG. 5.

FIG. 6 shows operating waveforms for the circuit.

The top plot shows the inductor current $I_{L1}$. The second plot shows the gate voltage $V_{M1G}$ of the GaN switch M1. The third plot shows the enable signal EN for the series switch SW. The bottom plot shows the voltage $V_{RCS}$ across the current sense resistor.

The turn on process of the power commutation GaN switch M1 is again not influenced by a voltage spike. In particular, by coupling the energy storage component C4 that drives the GaN between the gate and source of the power commutation switch M1, the influence of voltage spikes on sensing resistor RCS to the gate-source voltage is again avoided when the main switch is turned on.

The peak current sensing is again also not influenced for circuit loop control since the valid signal reflecting peak current is still present. The driver circuit can thus guarantee the operation of the power commutation switch with a single power supply while not influencing current sensing function for control loop.

The regulator 22 charges the series connection of the energy storage component C4 and the sensing component RCS, Eventually, the full output voltage of the regulator, e.g. 6V, will build on the capacitor C4. In this way, the circuit avoids the need for two regulators even though the controller 20 is referenced to ground.

Figure 7:
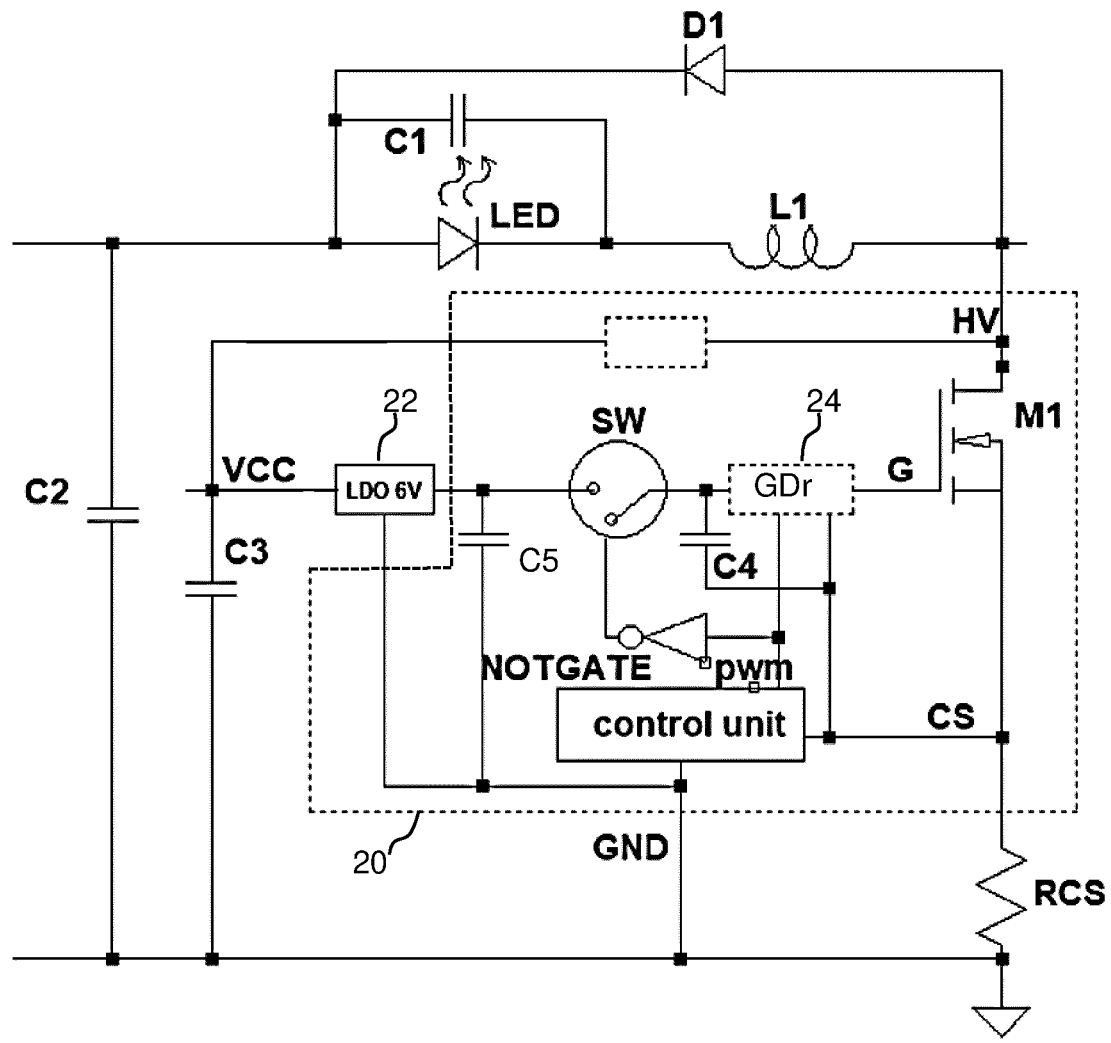
FIG. 7 shows the same circuit approach of FIG. 5 applied to a buck converter architecture.

FIG. 5 shows a boost converter architecture. FIG. 7 shows the same circuit approach applied to a buck converter topology The same components are given the same names. The circuit operates in the same way as the circuit of FIG. 4 but with the second approach as explained with reference to FIG. 5.

The invention may be used in any topology which has a GaN power commutation switch cascaded with current sensing resistor such as in a boost or buck converter, as described above. Those skilled in the art would understand that this invention may also be used in other topologies like buck-boost or flyback converter, or other types of converter to solve the problem of a sensing component interfering with the charging/discharging of an energy storage component to provide a turn on voltage to the power switch.

The invention may for example be used within a LED driver.

Variations to the disclosed examples can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality.

The mere fact that certain measures are recited in mutually different dependent claims does not indicate that a combination of these measures cannot be used to advantage.

If the term "adapted to" is used in the claims or description, it is noted that the term "adapted to" is intended to be equivalent to the term "configured to".

Any reference signs in the claims should not be construed as limiting the scope.

The invention claimed is:

1. A driver circuit for driving a power commutation GaN switch of a switch mode power converter, the power converter having in a power commutation an energy storage phase when the power commutation switch is closed and a freewheeling phase when the power commutation switch is open, the driver circuit comprising:
    a sensing component connectable to the GaN switch and adapted to sense a parameter of the power commutation, the sensing component being in a sensing path and comprising a sensing resistor;
    an energy storage component to provide a certain turn on voltage between the gate and source of the GaN switch;
    a controlling circuit connected to the GaN switch to control its switching according to the sensed parameter of the power commutation for feedback control purpose and to charge and discharge the energy storage component,
    wherein the controlling circuit is adapted to:
    charge the energy storage component via the sensing component to derive the certain turn on voltage between the gate and source of the GaN switch when the control unit does not use a signal on the sensing component for feedback control purpose at this time; or
    wherein the energy storage component is connectable across the gate of the GaN switch and a ground, the sensing component is connectable to a source of the GaN switch and the ground, and the controlling circuit is adapted to discharge the energy stored in the energy storage component to provide the certain turn on voltage to the GaN switch to turn the GaN switch on and bypass the sensing component at the same time.

2. The driver circuit of claim 1, wherein the driver circuit further comprises a control loop, preferably a feedback control loop that uses the parameter sensed by the sensing component.

3. The driver circuit of claim 1, wherein the control unit is adapted to:
    use the signal on the sensing component for feedback control purpose in the charging phase, and
    not use the signal on the sensing component for feedback control purpose throughout the freewheeling phase, and
    the energy storage component is coupled to the gate and source of the GaN switch, and the controlling circuit is adapted to charge the energy storage component via the sensing component in the freewheeling phase.

4. The driver circuit of claim 3, wherein the controlling circuit is adapted to charge the energy storage component from a supply voltage via the sensing component, in the freewheeling phase in which the control unit does not use the signal on the sensing component for feedback control purposes at this time.

5. The driver circuit of claim 4, wherein the supply voltage is coupled to the energy storage component via a voltage regulator, the voltage regulator is adapted to output the certain turn on voltage, and the controlling circuit is adapted to charge the voltage of the energy storage component to the output voltage of the voltage regulator.

6. The driver circuit of claim 5, wherein the voltage regulator is connected to ground, the cathode of the energy storage component is coupled to the ground via the sensing component, and the anode of the energy storage component is coupled to the gate of the GaN switch.

7. The driver circuit of claim 1, wherein the controlling circuit is adapted to bypass the sensing component by short circuiting the sensing component during turn on of the GaN switch such that the voltage of the energy storage component between the gate of the GaN switch and the ground is applied across the gate and source of the GaN switch without being partially taken on the sensing component.

8. The driver circuit of claim 7, wherein the controlling circuit is adapted to not bypass the sensing component such that the sensing component is adapted to sense an amount related to charged energy in the energy storing phase of the power commutation, after the GaN switch has been turned on.

9. The driver circuit of claim 7, wherein the driver circuit comprises a voltage regulator for supplying the controlling circuit from the energy storage component, and said voltage regulator is adapted to output the certain turn on voltage and is coupled to a gate drive terminal and ground.

10. The driver circuit of claim 9, comprising a shorting switch for shorting the sensing component, wherein the energy storage component is supplied by a supply voltage and connected to ground, and the controlling circuit is adapted to:
   discharge the energy storage component via the voltage regulator to provide the turn-on voltage across the gate and source of the GaN switch to turn on the GaN switch meanwhile temporally shorting the sensing component using the shorting switch; and
   end shorting of the sensing component after the GaN switch has been completely turned on, use the voltage on the energy storage component via the voltage regulator to keep the GaN switch on and allow the sensing component to sense the parameter of the energy storing phase.

11. The driver circuit of claim 10, wherein the energy storage component is coupled to the gate of the GaN switch via a Low Dropout regulator as the voltage regulator.

12. The driver circuit of claim 11, further comprising a gate driver circuit at the output of the Low Dropout regulator and the Low Dropout regulator and the gate driver circuit are connected to ground.

13. A power converter comprising:
   a power communication component;
   a GaN switch;
   a freewheeling diode; and
   the driver circuit of any one of claim 1 for driving the GaN switch.

14. The power converter of claim 13, wherein the power communication component, the GaN switch and the sensing component are in series between a power input and ground, and are adapted to define the sensing path.

15. The power converter of claim 13, comprising a boost converter, a buck converter, a buck-boost converter or a flyback converter.

* * * * *